United States Patent
Yamamoto

(10) Patent No.: US 7,425,873 B2
(45) Date of Patent: Sep. 16, 2008

(54) RADIO FREQUENCY AMPLIFICATION APPARATUS

(75) Inventor: Kouki Yamamoto, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 84 days.

(21) Appl. No.: 11/492,006

(22) Filed: Jul. 25, 2006

(65) Prior Publication Data

US 2007/0024375 A1    Feb. 1, 2007

(30) Foreign Application Priority Data

Jul. 27, 2005    (JP)    ............... 2005-216661

(51) Int. Cl.
    *H03F 3/191*    (2006.01)
(52) U.S. Cl. .................................. 330/302
(58) Field of Classification Search ............... 330/302, 330/149, 278, 133, 310
    See application file for complete search history.

(56) References Cited

U.S. PATENT DOCUMENTS

2007/0146074 A1*    6/2007    Osman ................ 330/278

FOREIGN PATENT DOCUMENTS

| JP | 2001-144550 A | 5/2001 |
|---|---|---|
| JP | 2003-309435 A | 10/2003 |

\* cited by examiner

*Primary Examiner*—Robert Pascal
*Assistant Examiner*—Hieu P Nguyen
(74) *Attorney, Agent, or Firm*—McDermott Will & Emery LLP

(57) ABSTRACT

An intermodulation distortion which is output from a final-stage amplifier 15 is fed back to an inter-stage matching circuit 14 via a first control circuit 16 and a second control circuit 17. The first control circuit 16 and the second control circuit 17 control an amplitude and a phase of an intermodulation distortion to be fed back from the final-stage amplifier 15 to the inter-stage matching circuit 14, such that a synthesized scalar of an intermodulation distortion input from a first-stage amplifier 13 to the final-stage amplifier 15 and amplified by the final-stage amplifier 15 and an intermodulation distortion newly generated by the final-stage amplifier 15 is reduced.

6 Claims, 12 Drawing Sheets

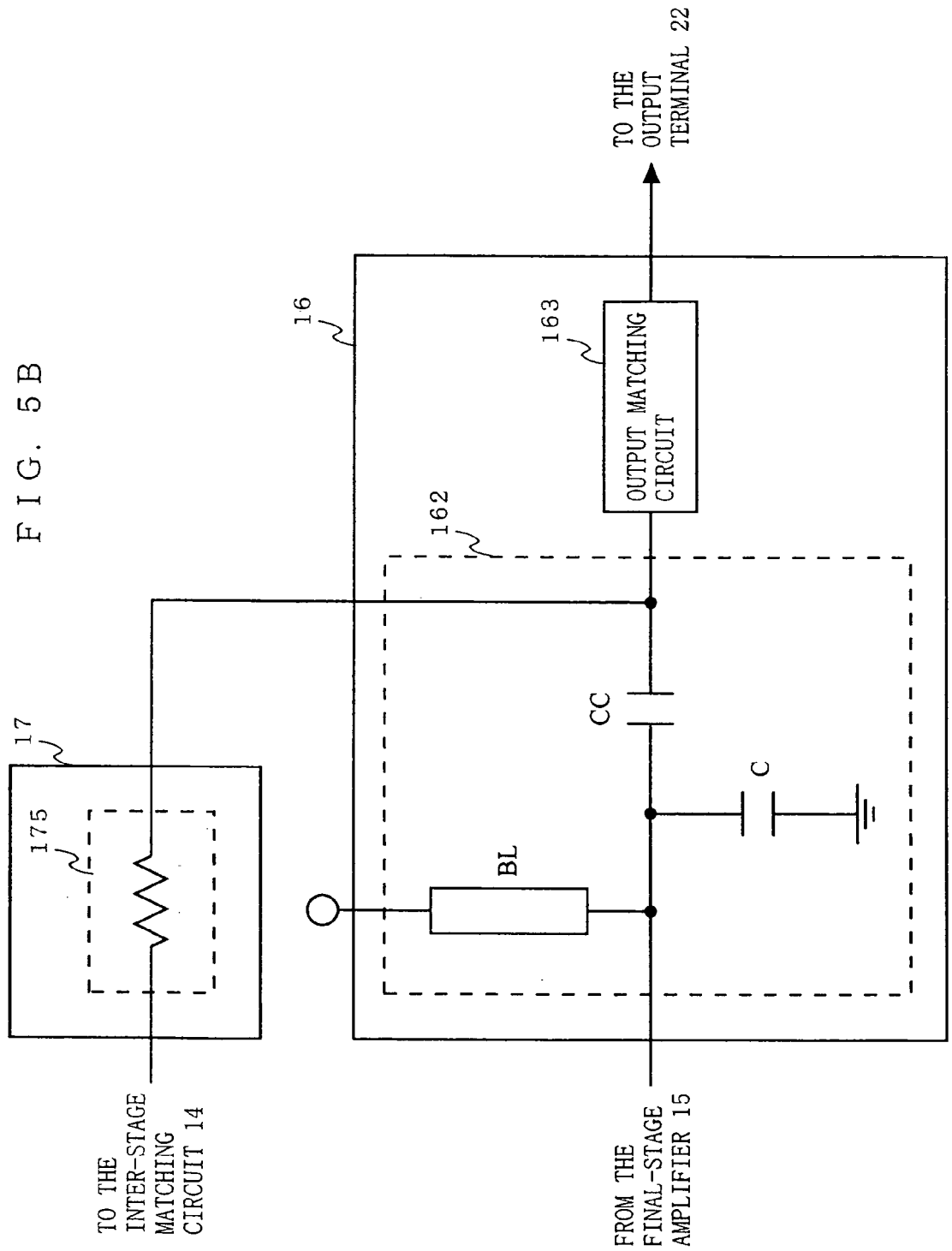

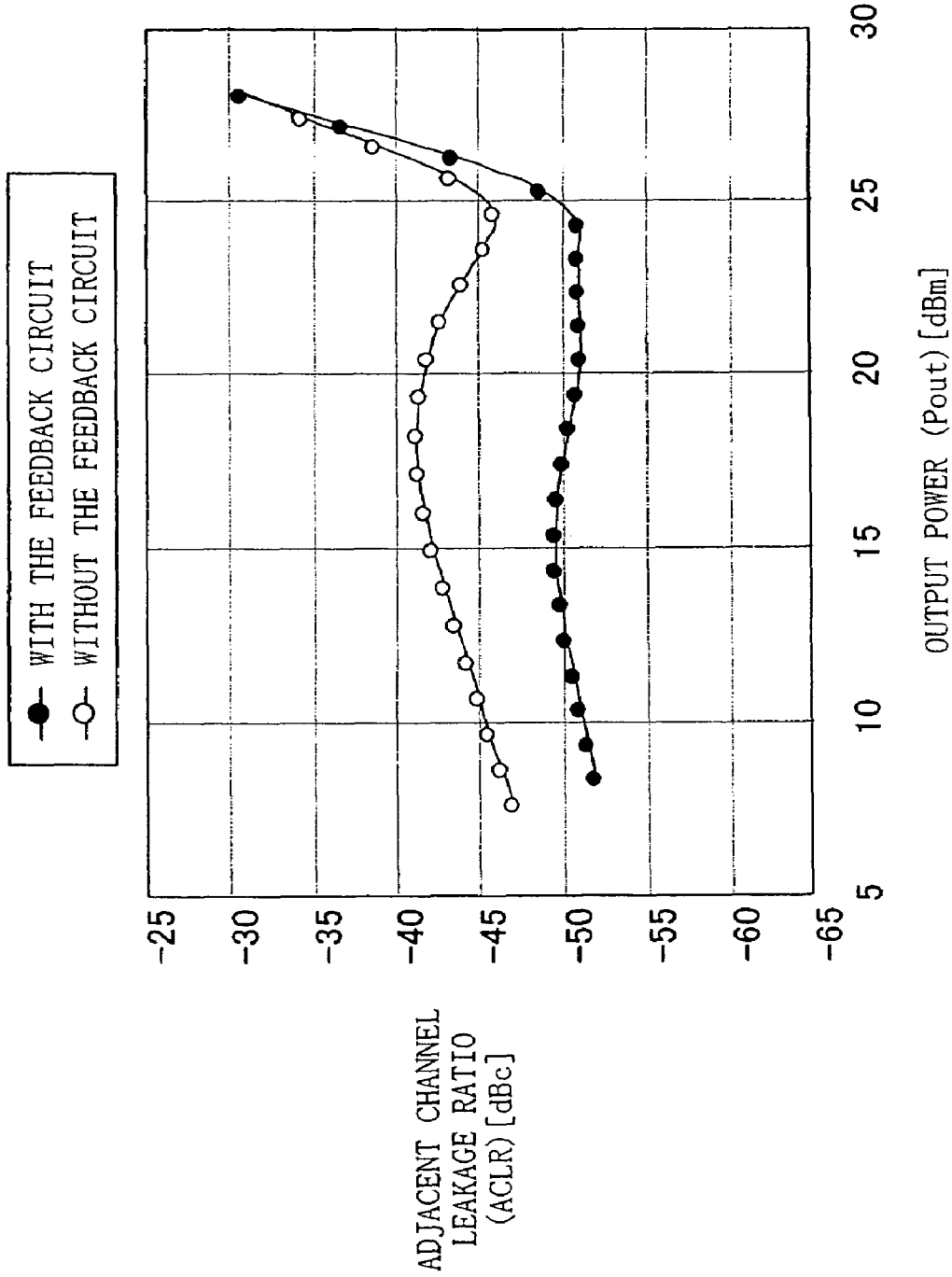
F I G. 7

RADIO FREQUENCY AMPLIFICATION APPARATUS

BACKGROUND OF THE INVENTION

1. Field of the Invention

The present invention relates to a radio frequency amplification apparatus, usable for wireless communication or the like, including a plurality of radio frequency amplifiers connected to each other.

2. Description of the Background Art

A radio frequency amplification apparatus is required to provide low distortion for keeping linearity and to have high efficiency for reducing power consumption. Especially, a radio frequency amplification apparatus used for digital cellular phones is strongly desired to provide lower distortion and higher efficiency because such characteristics directly contribute to the size reduction of the cellular phones. However, decrease in distortion and increase in efficiency contradict each other. Therefore, a radio frequency amplification apparatus is generally designed to fulfill the standards of the distortion characteristic in accordance with the modulation system of the corresponding cellar phone while maximizing the efficiency.

For solving the contradiction, a distortion compensation circuit technology is conventionally proposed.

As one example of the distortion compensation circuit technology, Japanese Laid-Open Patent Publication No. 2001-144550 (patent document 1) discloses a method of adding a pre-distortion circuit on the input side of the radio frequency amplification apparatus including a plurality of radio frequency amplifiers connected to each other (not shown). Japanese Laid-Open Patent Publication No. 2003-309435 (patent document 2) discloses a radio frequency amplification apparatus including a plurality of radio frequency amplifiers connected to each other as follows. An intermodulation distortion generated by a first-stage radio frequency amplifier and an intermodulation distortion generated by a final-stage radio frequency amplifier counteract each other, as a result of which the distortion of the output is suppressed.

FIG. 8 shows an exemplary structure of a conventional radio frequency amplification apparatus described in patent document 2. The conventional radio frequency amplification apparatus includes an input matching circuit 120, a first-stage amplifier 130, an inter-stage matching circuit 140, a final-stage amplifier 150, and an output matching circuit 160. With this conventional radio frequency amplification apparatus, the size and the bias condition of the first-stage amplifier 130, the circuit constant of the inter-stage matching circuit 140 and the like are adjusted such that the intermodulation distortion generated by the final-stage amplifier 150 is invert in phase to the intermodulation distortion generated by the first-stage amplifier 130 and amplified by the final-stage amplifier 150. As a result, the distortion of the output is suppressed. In this manner, the conventional radio frequency amplification apparatus improves the linearity of the amplification characteristic between an input terminal 210 and an output terminal 220.

However, the conventional radio frequency amplification apparatuses have the following problems. The pre-distortion circuit described in patent document 1 indispensably has an excessively large circuit scale as well known in the art. Therefore, a radio frequency amplification apparatus using such a pre-distortion circuit is not practically usable to cellular phones or the like desired to be more compact.

The conventional radio frequency amplification apparatus described in patent document 2 is not suitable either to devices desired to be compact because the inter-stage matching circuit 140 inevitably has a large scale for adjusting the phase of the intermodulation distortion. In addition, with only the inter-stage matching circuit 140, it is technologically impossible to make an adjustment such that an intermodulation distortion generated by the final-stage amplifier 150 and an intermodulation distortion generated by the first-stage amplifier 120 and amplified by the final-stage amplifier 150 are completely invert in phase to each other, however large the scale of the inter-stage matching circuit 140 may be.

SUMMARY OF THE INVENTION

Therefore, an object of the present invention is to provide a radio frequency amplification apparatus capable of realizing both increase in efficiency and decrease in distortion and capable of reducing the size thereof.

The present invention is directed to a radio frequency amplification apparatus including a plurality of radio frequency amplifiers connected to each other. For attaining the object mentioned above, the radio frequency amplification apparatus according to the present invention comprises an input matching circuit operable to perform matching processing with a pre-stage device; a first-stage amplifier operable to amplify an output from the input matching circuit; an inter-stage matching circuit operable to perform matching processing with the first-stage amplifier; a final-stage amplifier operable to amplify an output from the inter-stage matching circuit; and a control circuit operable to perform matching processing between the final-stage amplifier and a post-stage device and feed back an output intermodulation distortion which is output from the final-stage amplifier to the inter-stage matching circuit with a predetermined amplitude and a predetermined phase. The control circuit controls the amplitude and the phase of the output intermodulation distortion such that an intermodulation distortion having a generally invert phase to an intermodulation distortion newly generated by the final-stage amplifier is generated by synthesizing the output intermodulation distortion and an intermodulation distortion generated by the first-stage amplifier.

According to a preferable structure, the control circuit comprises an output matching circuit operable to perform matching processing between the final-stage amplifier and the post-stage device; an amplitude control circuit operable to control an amplitude of an intermodulation distortion which is output from the output matching circuit by attenuating a desired amount; and a phase control circuit operable to rotate a phase of the intermodulation distortion which is output from the output matching circuit by allowing a desired frequency to pass therethrough.

With this structure, the amplitude control circuit may be a series resistor inserted at a feedback path; and the phase control circuit may be a capacitor-inductor-capacitor circuit inserted at the feedback path. Alternatively, the phase control circuit may be a capacitor-capacitor circuit inserted at a feedback path; and the amplitude control circuit may be a parallel resistor connected between the capacitors.

According to another preferable structure, the control circuit comprises a phase control/matching circuit operable to perform a part of the matching processing between the final-stage amplifier and the post-stage device and to rotate a phase of the output intermodulation distortion which is output from the final-stage amplifier by allowing a desired frequency to pass therethrough; an output matching circuit operable to perform the remaining part of the matching processing between the final-stage amplifier and the post-stage device; and an amplitude control circuit operable to control an amplitude of an intermodulation distortion which is output from the phase control/matching circuit by attenuating a desired amount.

With this structure, the phase control/matching circuit may include a bias line and a parallel capacitor connected in parallel to the output intermodulation distortion which is output from the final-stage amplifier, and a DC cut capacitor inserted in series at a stage post to the parallel capacitor; and the amplitude control circuit may be a series resistor inserted between an output of the DC cut capacitor and the inter-stage matching circuit. Alternatively, the phase control/matching circuit may include a bias line and a parallel capacitor connected in parallel to the output intermodulation distortion which is output from the final-stage amplifier; and the amplitude control circuit may be a parallel resistor inserted at a path connected to an output of the parallel capacitor and to a parallel circuit component of the inter-stage matching circuit.

According to the present invention, the higher efficiency and the lower distortion can be both provided. In addition, the structure of the inter-stage matching circuit for performing the distortion compensation can be simplified. Therefore, the apparatus requires a smaller number of components and thus is decreased in size.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5B shows a more specific structure of the third circuit example;

FIG. 7 shows that a distortion which is output from the radio frequency amplification apparatus is improved by feeding back a third-order intermodulation distortion.

DESCRIPTION OF THE PREFERRED EMBODIMENTS

Hereinafter, an embodiment of the present invention will be described with reference to the drawings.

Figure 1:
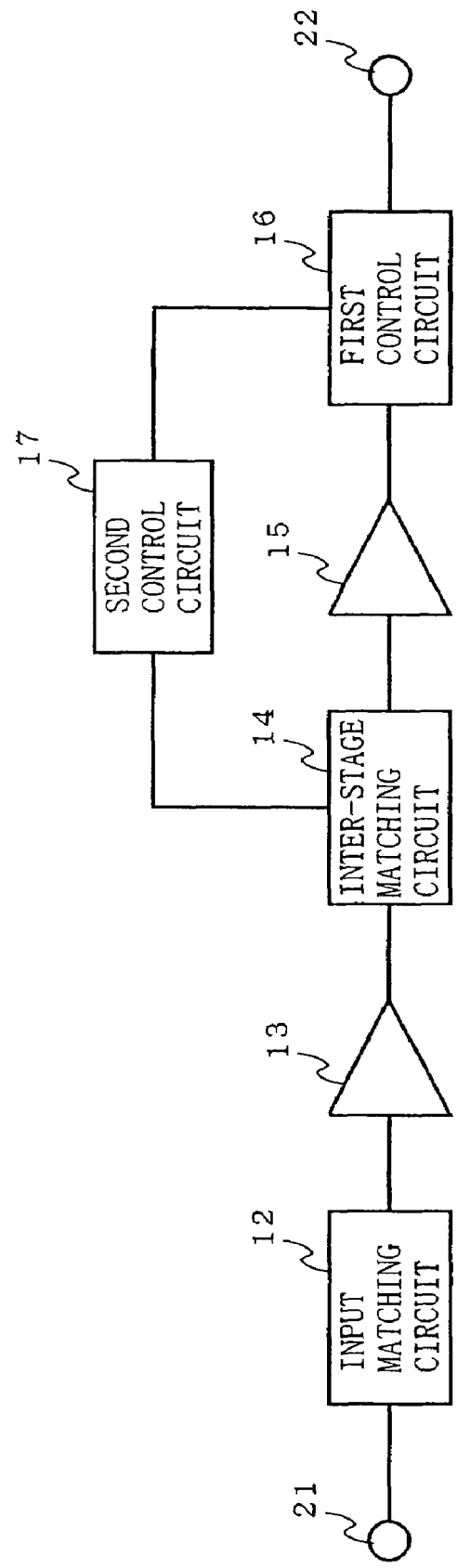
FIG. 1 is a block diagram showing an exemplary structure of a radio frequency amplification apparatus according to one embodiment of the present invention.

FIG. 1 is a block diagram showing an exemplary structure of a radio frequency amplification apparatus according to one embodiment of the present invention. As shown in FIG. 1, a radio frequency amplification apparatus according to the present invention includes an input matching circuit 12, a first-stage amplifier 13, an inter-stage matching circuit 14, a final-stage amplifier 15, a first control circuit 16, and a second control circuit 17.

The input matching circuit 12 performs gain matching, distortion matching and the like (hereinafter, referred to as "matching processing") between the radio frequency amplification apparatus according to the present invention and a pre-stage device (not shown) connected to an input terminal 21. The first-stage amplifier 13 amplifies a radio frequency signal which is input thereto from the input terminal 21 via the input matching circuit 12 at a predetermined gain. The inter-stage matching circuit 14 performs matching processing between the first-stage amplifier 13 and the final-stage amplifier 15. The final-stage amplifier 15 further amplifies the radio frequency signal which is input thereto from the first-stage amplifier 13 via the inter-stage matching circuit 14 at a predetermined gain.

The first control circuit 16 and the second control circuit 17 have an output matching function of performing matching processing between the final-stage amplifier 15 and a post-stage device (not shown) connected to an output terminal 22, and an amplitude control feedback function and a phase control feedback function for feeding back a third-order intermodulation distortion (feedback signal) to the inter-stage matching circuit 14. Various exemplary circuit configurations for realizing these three functions will be described later in detail.

Figure 2:
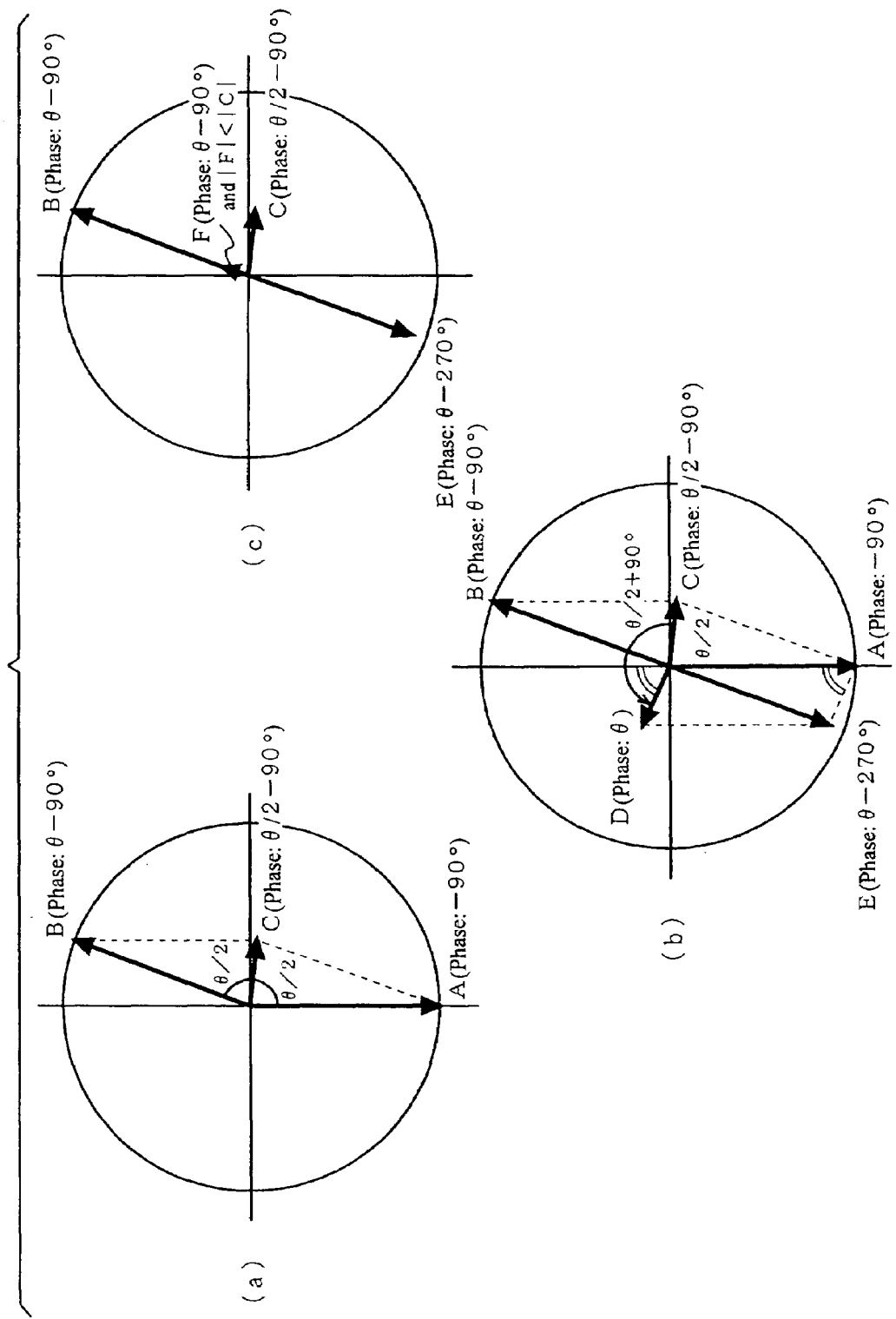
FIG. 2 shows vector diagrams each illustrating a state of a third-order intermodulation distortion on the input side and the output side of a final-stage amplifier 15 on a phase plane.

The radio frequency amplification apparatus having the above-described structure has a feature in that processing by the first control circuit 16 and the second control circuit 17 feeds a third-order intermodulation distortion having the amplitude and the phase thereof property controlled from the output side of the final-stage amplifier 15 back to the input side thereof, thereby suppressing the third-order intermodulation distortion generated on the output side. Hereinafter, the principle of such a function will be explained. FIG. 2 shows vector diagrams each illustrating a state of the third-order intermodulation distortion on the input side and the output side of the final-stage amplifier 15 on a phase plane.

Part (a) of FIG. 2 shows a conventional fundamental distortion vector relationship among a third-order intermodulation distortion A generated by the first-stage amplifier 13 and input to and amplified by the final-stage amplifier 15, a third-order intermodulation distortion B newly generated by the final-stage amplifier 15, and a third-order intermodulation distortion C obtained by synthesizing the third-order intermodulation distortion A and the third-order intermodulation distortion B. In this example, it is assumed that the phase of the third-order intermodulation distortion A is [−90°] and the phase of the third-order intermodulation distortion B is [θ−90°], with a phase difference between the third-order intermodulation distortion A and the third-order intermodulation distortion B being [θ°].

The first control circuit 16 and the second control circuit 17 generate a third-order intermodulation distortion D and feed the third-order intermodulation distortion D back to the input side of the final-stage amplifier 15. The amplitude and phase of the third-order intermodulation distortion D are controlled by the first control circuit 16 and the second control circuit 17, such that a third-order intermodulation distortion E generated by synthesizing the third-order intermodulation distortion D and the third-order intermodulation distortion A has an invert phase to the third-order intermodulation distortion B (i.e., a phase of θ−270°] (see part (b) of FIG. 2). Namely, the third-order intermodulation distortion D has a phase obtained by rotating the third-order intermodulation distortion C at [θ/2+90°], i.e., has a phase of [θ°].

As a result, the final-stage amplifier 15 outputs a third-order intermodulation distortion F obtained by synthesizing the third-order intermodulation distortion B and the third-order intermodulation distortion E (see part (c) of FIG. 2). The amplitude amount (scalar) of the third-order intermodulation distortion F is sufficiently smaller than that of the third-order intermodulation distortion C.

In this example, the third-order intermodulation distortion A and the third-order intermodulation distortion B have the same scalar. Even when the third-order intermodulation distortions have different scalars from each other, the above-described control can be performed by phase calculation based on the same principle as described above. In general, the third-order intermodulation distortion A generated by the first-stage amplifier 13 has a larger amplitude than that of the third-order intermodulation distortion B newly generated by the final-stage amplifier 15. In this case, the control is performed such that the phase rotation amount of the third-order intermodulation distortion D with respect to the third-order intermodulation distortion C is smaller, and such that the scalar of the third-order intermodulation distortion E obtained by synthesizing the third-order intermodulation distortion D and the third-order intermodulation distortion A is equal to the scalar of the third-order intermodulation distortion B. Thus, the third-order intermodulation distortion F which is output from the final-stage amplifier 15 can be suppressed.

According to the present invention, the second control circuit 17 includes a passive element. Therefore, the scalar of the third-order intermodulation distortion D to be fed back may be occasionally insufficient to control the third-order intermodulation distortion E to have a completely invert phase to that of the third-order intermodulation distortion B. However, there is still an effect that the third-order intermodulation distortion F can be suppressed by the amount by which the third-order intermodulation distortion E becomes closer to an invert phase to the third-order intermodulation distortion B than the third-order intermodulation distortion A is.

Next, with reference to FIG. 3A through FIG. 6B, detailed circuit configurations of the first control circuit 16 and the second control circuit 17 will be described.

Figure 3A:
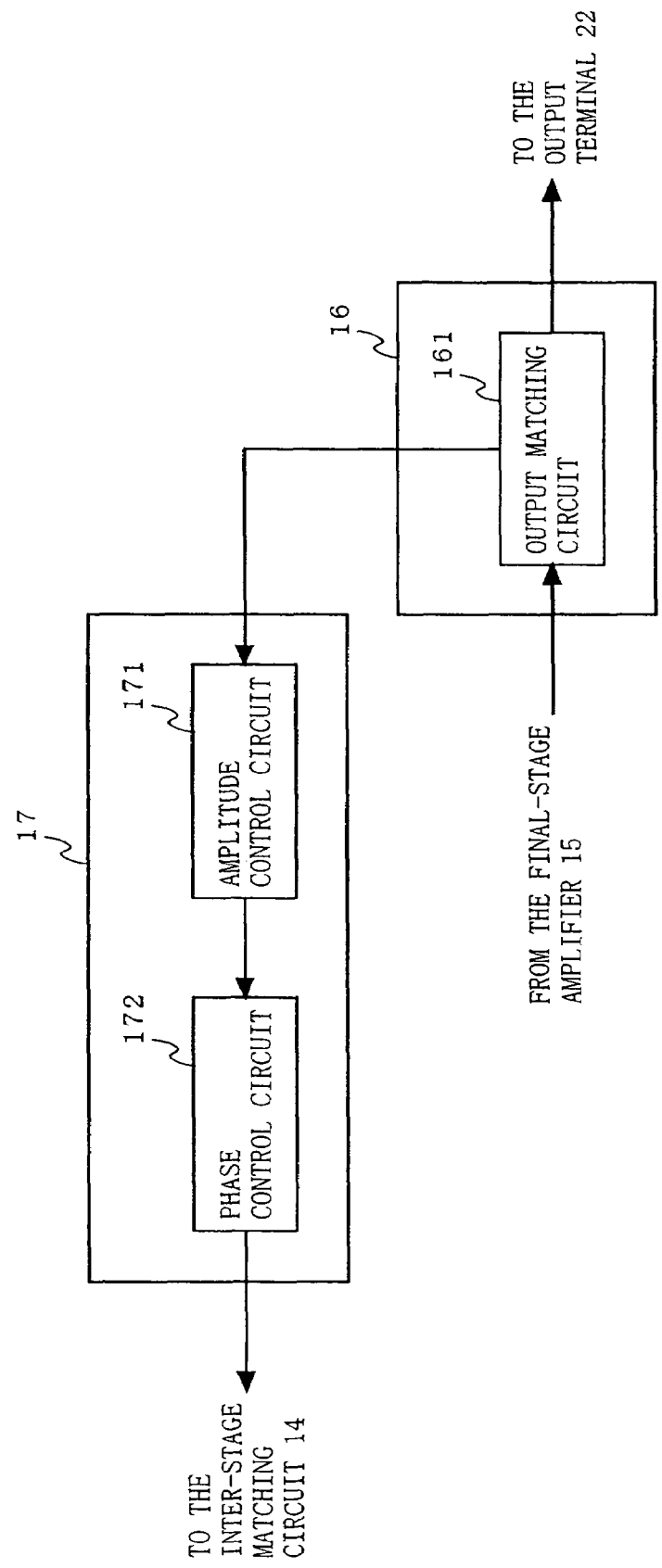
FIG. 3A shows a first circuit example.
Figure 3B:
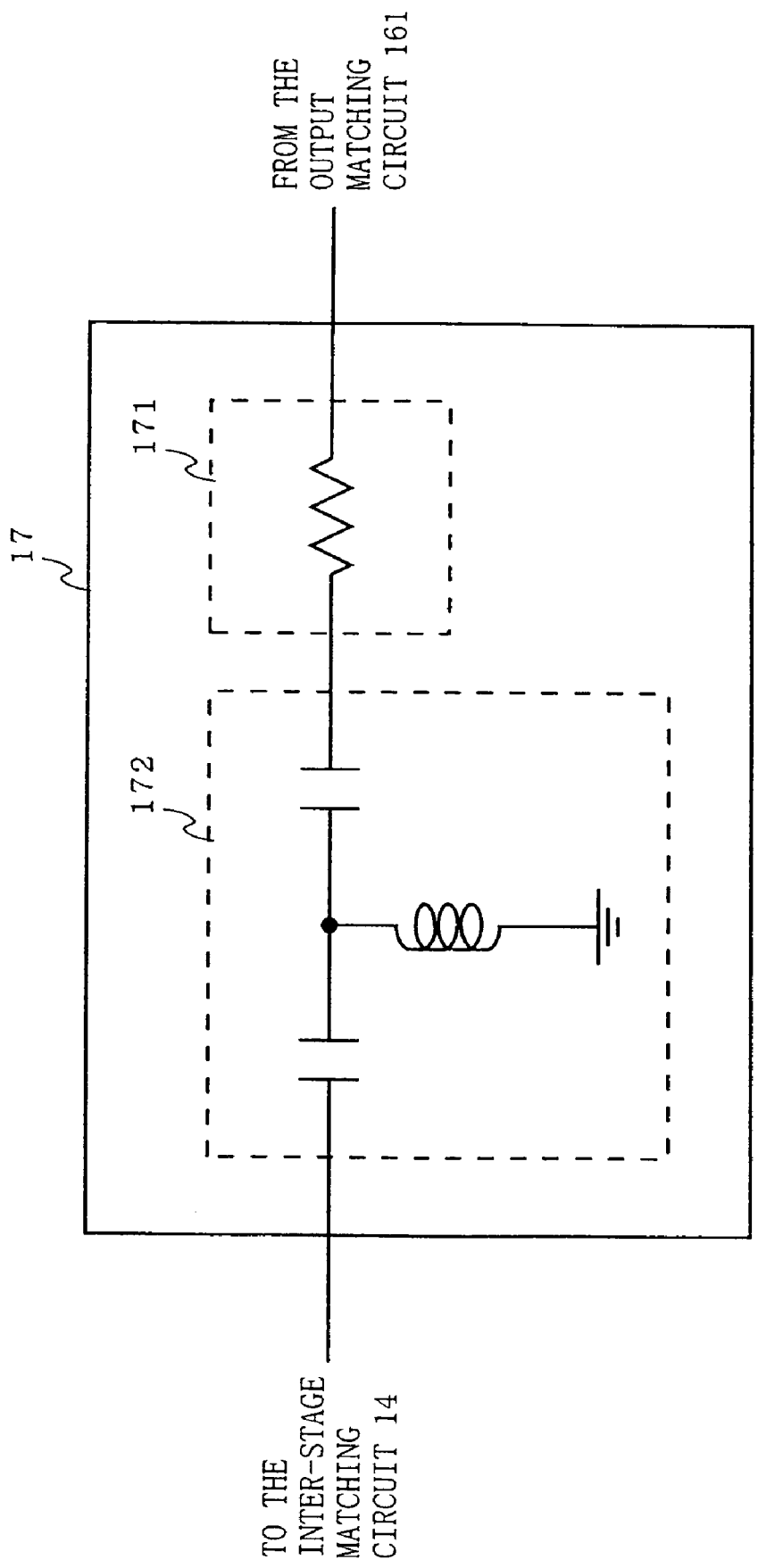
FIG. 3B shows a more specific structure of the first circuit example.
Figure 4A:
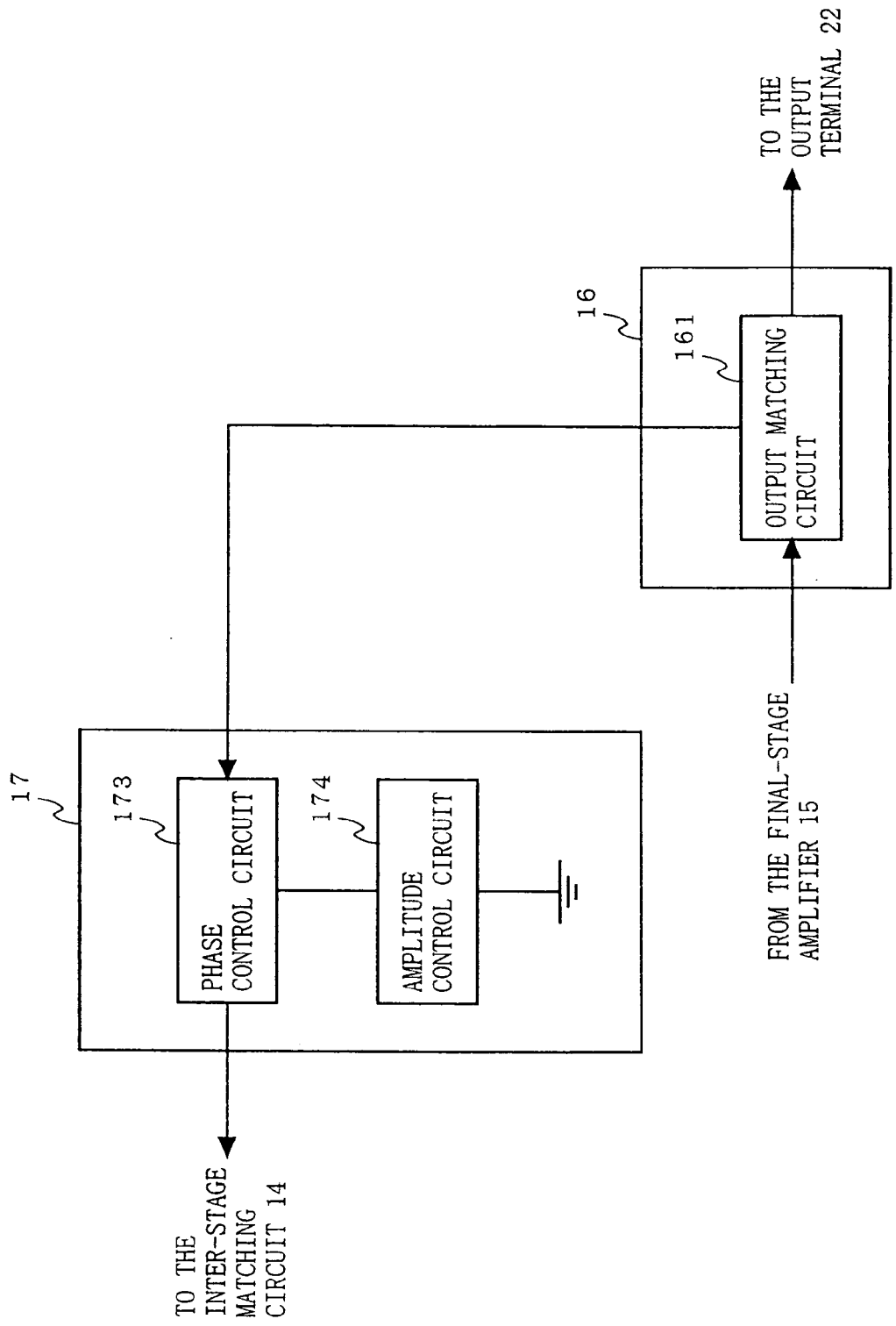
FIG. 4A shows a second circuit example.
Figure 4B:
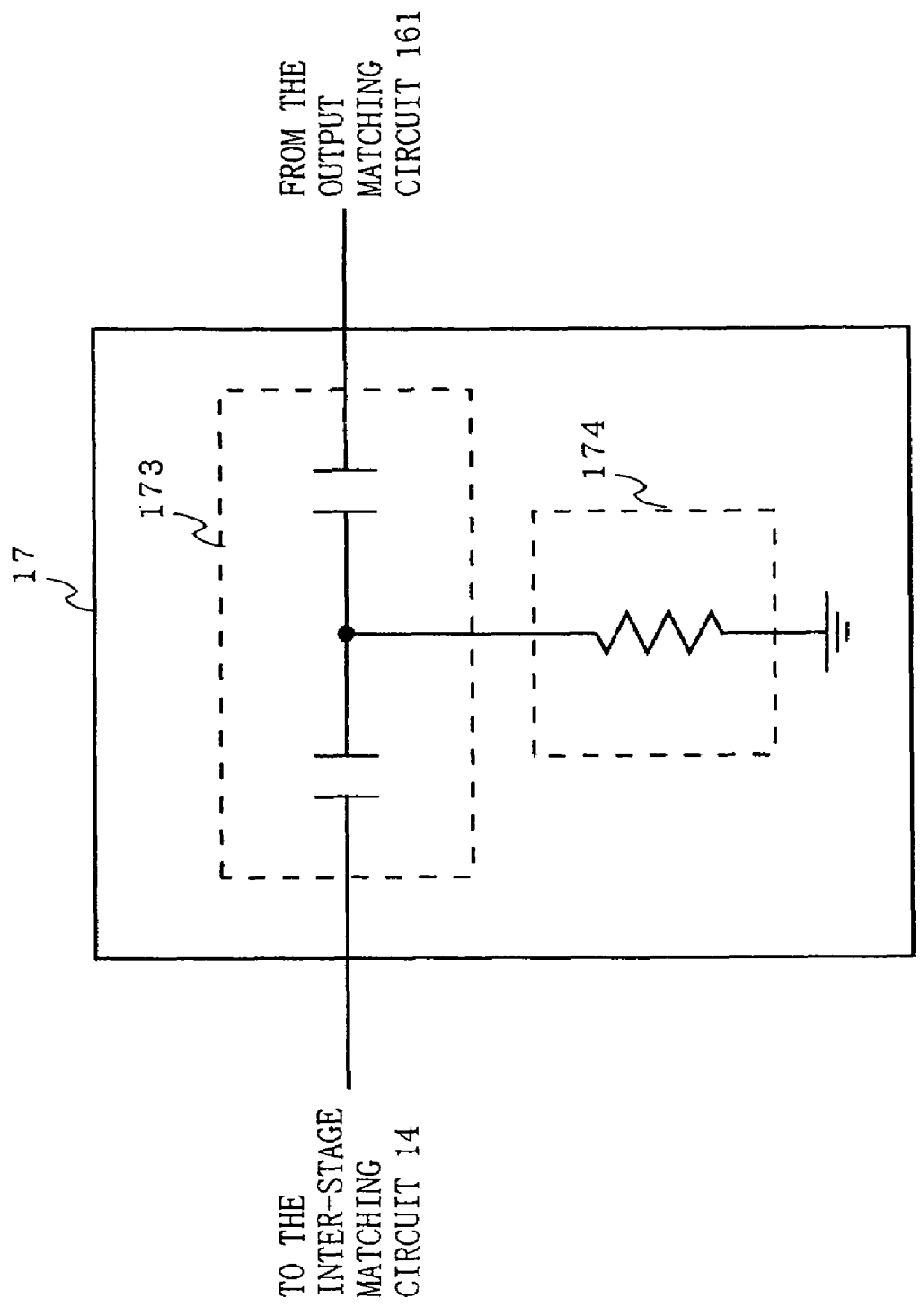
FIG. 4B shows a more specific structure of the second circuit example.
Figure 5A:
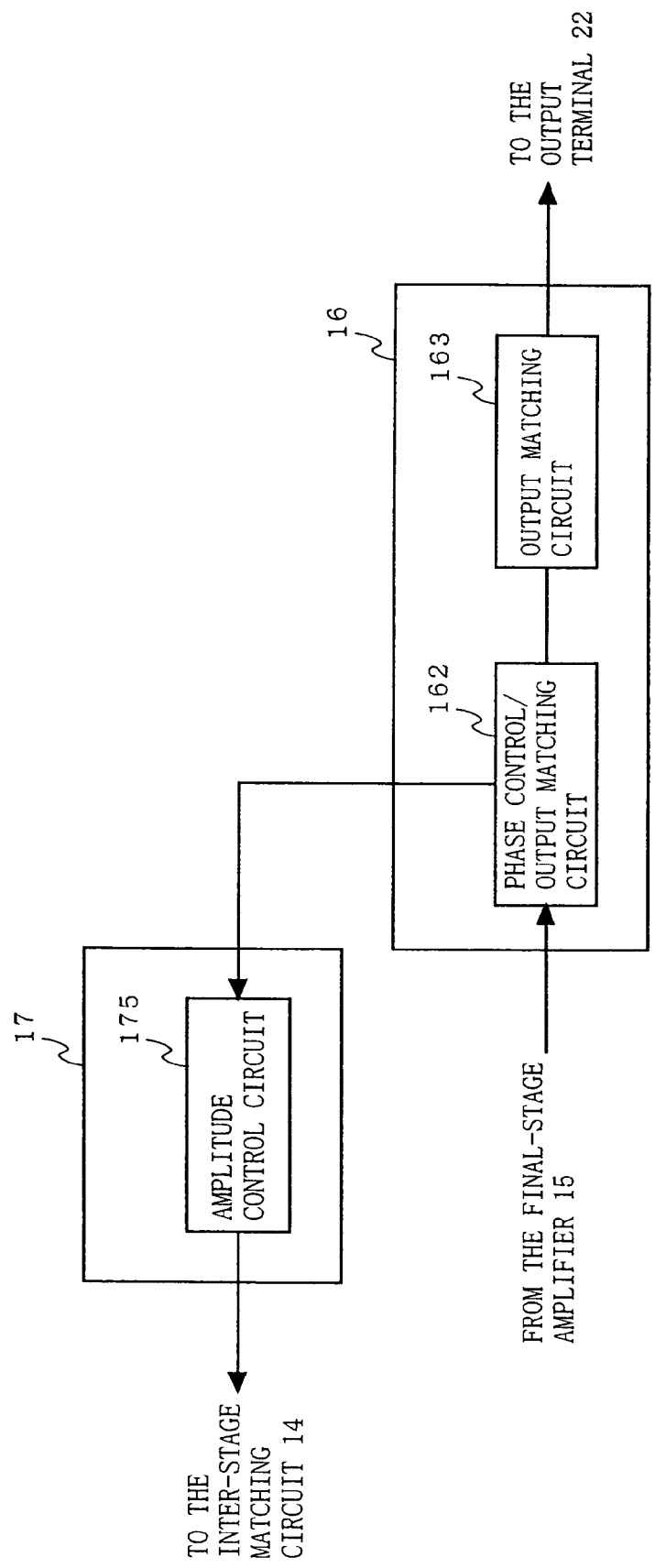
FIG. 5A shows a third circuit example.
Figure 6A:
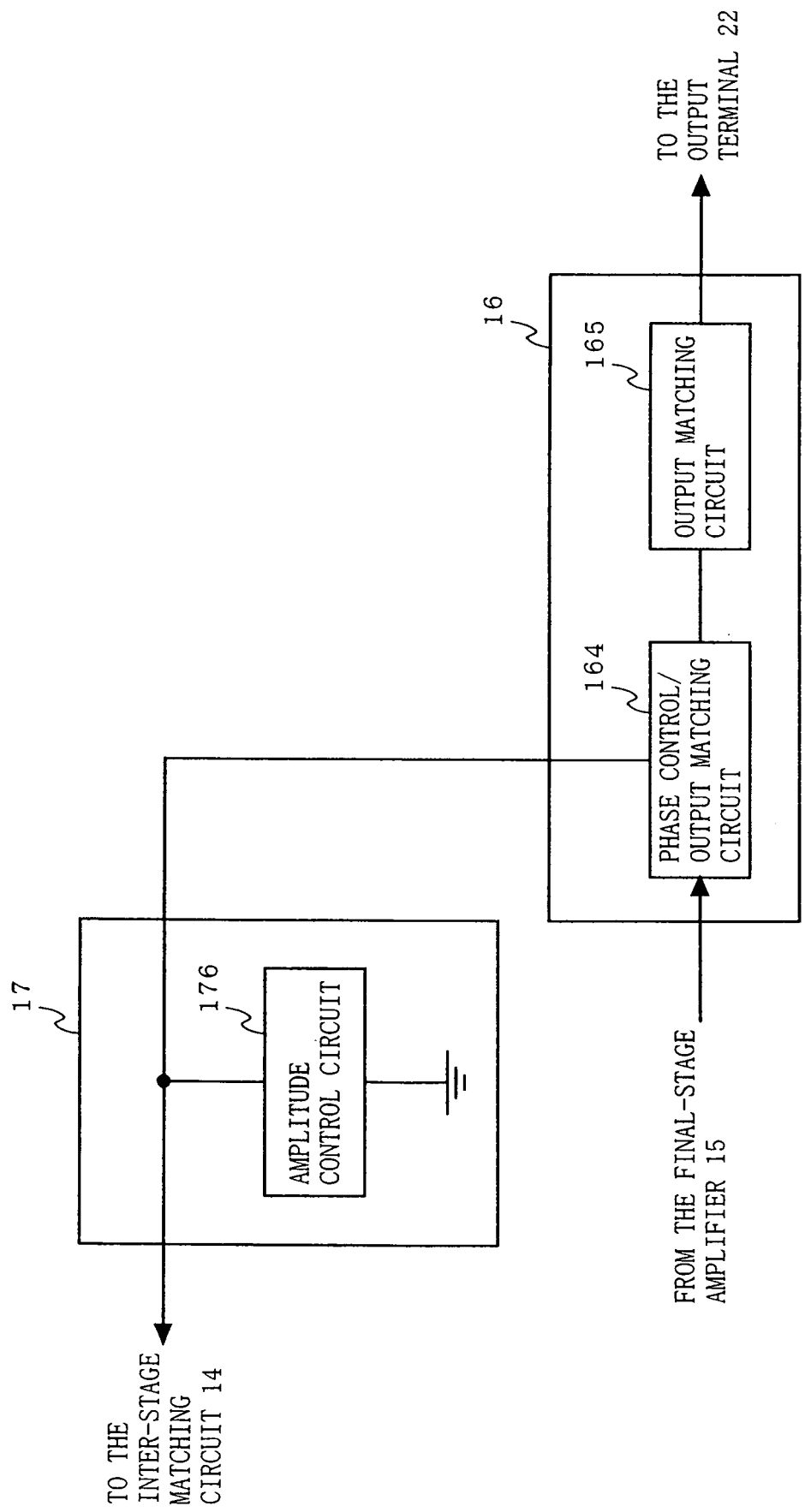
FIG. 6A shows a fourth circuit example.
Figure 6B:
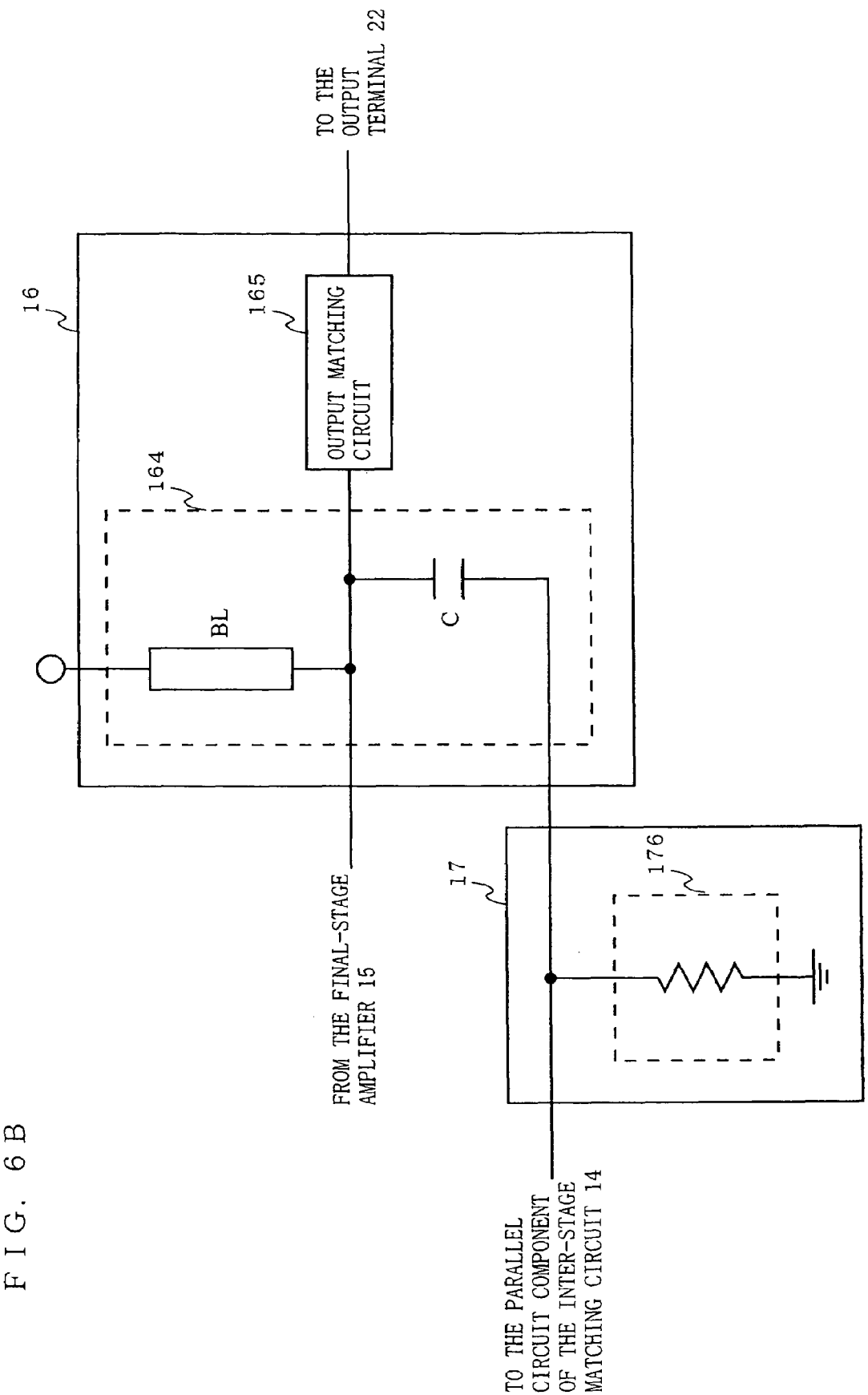
FIG. 6B shows a more specific structure of the fourth circuit example.
Figure 8:
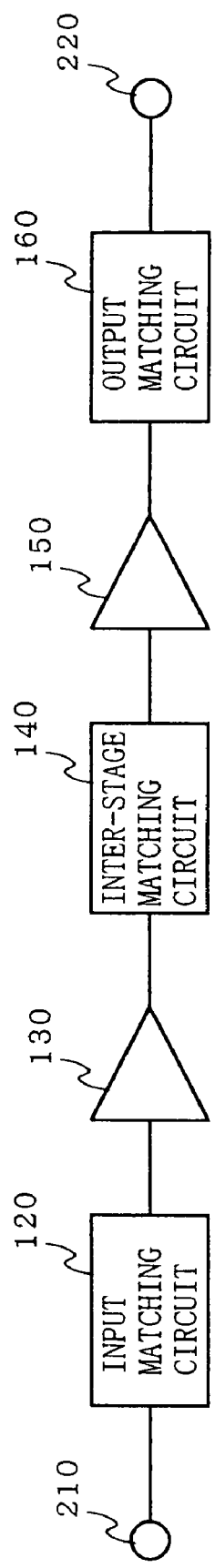
FIG. 8 is a block diagram showing a structure of a conventional radio frequency amplification apparatus.

FIG. 3A shows a first circuit example applicable to the first and second control circuits 16 and 17. FIG. 3B shows a more specific structure of the first circuit example. FIG. 4A shows a second circuit example applicable to the first and second control circuits 16 and 17. FIG. 4B shows a more specific structure of the second circuit example. FIG. 5A shows a third circuit example applicable to the first and second control circuits 16 and 17. FIG. 5B shows a more specific structure of the third circuit example. FIG. 6A shows a fourth circuit example applicable to the first and second control circuits 16 and 17. FIG. 6B shows a more specific structure of the fourth circuit example.

First Circuit Example

In this circuit example, the first control circuit 16 has the output matching function, and the second control circuit 17 has the amplitude control feedback function and the phase control feedback function. The first control circuit 16 includes an output matching circuit 161 equivalent to that of the conventional art. The second control circuit 17 includes an amplitude control circuit 171 for controlling the amplitude of the feedback signal by attenuating a desired amount, and a phase control circuit 172 for rotating the phase of the feedback signal by allowing only a desired frequency to pass therethrough. The amplitude control circuit 171 and the phase control circuit 172 are connected in series. Typically, a series resistor is used for the amplitude control circuit 171, and a capacitor-inductor-capacitor circuit is used for the phase control circuit 172.

Second Circuit Example

In this circuit example also, the first control circuit 16 has the output matching function, and the second control circuit 17 has the amplitude control feedback function and the phase control feedback function. The first control circuit 16 includes an output matching circuit 161 equivalent to that of the conventional art. The second control circuit 17 includes a phase control circuit 173 for rotating the phase of the feedback signal by allowing only a desired frequency to pass therethrough, and an amplitude control circuit 174 for controlling the amplitude of the feedback signal by attenuating a desired amount. The phase control circuit 173 and the amplitude control circuit 174 are connected in parallel. Typically, a capacitor-capacitor circuit is used for the phase control circuit 173, and a parallel resistor is used for the amplitude control circuit 174.

In the first and second circuit examples, neither a large scale circuit such as an active element or the like nor a complicated circuit including a passive element is required in order to perform distortion compensation, unlike the conventional art.

Third Circuit Example

In this circuit example, the first control circuit 16 has the phase control feedback function and the output matching function, and the second control circuit 17 has the amplitude control feedback function. The first control circuit 16 includes a phase control/output matching circuit 162 for rotating the phase of the feedback signal by allowing only a desired frequency to pass therethrough and performing initial matching, and an output matching circuit 163 for performing final matching. The second control circuit 17 includes an amplitude control circuit 175 for controlling the amplitude of the feedback signal by attenuating a desired amount. Typically, a bias line BL, a parallel capacitor C and a DC cut capacitor CC are used for the phase control/output matching circuit 162, and a series resistor is used for the amplitude control circuit 175.

A signal which has passed through the DC cut capacitor CC is divided and input to the output matching circuit 163 and the amplitude control circuit 175. Ideally, the bias line BL opens the fundamental frequency impedance on the power supply side seen from the final-stage amplifier 15 and thus requires $\lambda/4$ as an electrical length. However, it is practically difficult to obtain such an electrical length. Therefore, the circuit is designed such that the fundamental frequency impedance becomes close to being open by impedance conversion by the bias line BL and the parallel capacitor C.

As described above with reference to FIG. 2, the phase rotation amount required for a feedback signal is $\theta/2+90°$. However, in most amplifiers, the phase difference between the third-order intermodulation distortion A amplified by the amplifier and the third-order intermodulation distortion E generated by the amplifier is 90° through 180°. Therefore, it is sufficient as long as the phase rotation of the feedback signal can be done at an angle in the range of 135° through 180°. With the phase control/output matching circuit 162, the electrical length ($\lambda/4$ through $\lambda/12$) of the bias line BL and the capacitance of the parallel capacitor C can be adjusted, such that the phase of the feedback signal after passing through the bias line BL and the parallel capacitor C is controlled to be rotated at an angle in the range of 135° through 180°. For example, with the fundamental frequency of 830 MHz, where the electrical length of the bias line BL is λ/12 and the capacitance of the parallel capacitor C is 10 pF, the phase of the feedback signal is rotated at about 160°. The DC cut capacitor CC is inserted such that the power supply is not shortcircuited from the inter-stage matching circuit 14 or the output terminal 22.

In the third circuit example, a part of the output matching circuit is also used as the phase control circuit in order to perform distortion compensation. Therefore, neither a large scale circuit such as an active element or the like nor a complicated circuit including a passive element is required, unlike the conventional art.

Fourth Circuit Example

In this circuit example also, the first control circuit 16 has the phase control feedback function and the output matching function, and the second control circuit 17 has the amplitude control feedback function. The first control circuit 16 includes a phase control/output matching circuit 164 for rotating the phase of the feedback signal by allowing only a desired frequency to pass therethrough and performing initial matching, and an output matching circuit 165 for performing final matching. The second control circuit 17 includes an amplitude control circuit 176 for controlling the amplitude of the feedback signal by attenuating a desired amount. Typically, a bias line BL and a parallel capacitor C are used for the phase control/output matching circuit 164, and a parallel resistor is used for the amplitude control circuit 176.

With this circuit example, a signal having a desired phase thereof rotated by the bias line BL and the parallel capacitor C is fed back from the GND side of the parallel capacitor C via the GND side of a parallel circuit component (not shown) of the inter-stage matching circuit 14. In addition, the feedback amount is controlled by adjusting the resistance value of the parallel resistor 176 inserted between the GND and a connection point between the GND side of the parallel capacitor C and the GND side of the parallel circuit component. Instead of the parallel resistor 176, any passive element which has a desired frequency having isolation with respect to the GND, for example, a parallel inductor, a line pattern or a VIA hole, is usable because such an element can allow the amount of isolation to be adjusted to control the feedback amount.

FIG. 7 shows that the distortion which is output from the radio frequency amplification apparatus shown in each of FIG. 5A and FIG. 6A is improved by feeding back a third-order intermodulation distortion. FIG. 7 shows the output power dependency of the adjacent channel leakage ratio (ACLR), which is a distortion at a frequency which is 5 MHz away. The ACLR is an example of the third-order intermodulation distortion required of a signal which is output from the radio frequency amplification apparatus when a WCDMA modulation signal is input thereto. It is understood from FIG. 7 that the distortion can be improved over a wide range of the output power by feeding back the third-order intermodulation distortion (see the black-dotted curve ("with the feedback circuit")).

In the third and fourth circuit examples, a part of the output matching circuit is also used as the phase control circuit in order to perform distortion compensation. Therefore, neither a large scale circuit such as an active element or the like nor a complicated circuit including a passive element is required, unlike the conventional art. Especially in the fourth circuit example, the DC cut capacitor can be omitted because the signal is fed back via the parallel capacitor C.

As described above, a radio frequency amplification apparatus according to one embodiment of the present invention performs feedback control such that a scalar of a synthesized vector of a distortion vector input to, and amplified by, the final-stage amplifier and a distortion victor newly generated by the final-stage amplifier is reduced. Thus, it is made possible both to increase the efficiency and to decrease the distortion. In addition, the structure of the inter-stage matching circuit for performing the distortion compensation can be simplified. Therefore, the apparatus requires a smaller number of components and is decreased in size.

In the above-described embodiment, the radio frequency amplification apparatus includes amplifiers in two stages connected to each other. The number of the amplifiers inserted between the first-stage amplifier 13 and the inter-stage matching circuit 14 is not limited as long as the final stage of the apparatus includes the inter-stage matching circuit 14, the final-stage amplifier 15, the first control circuit 16 and the second control circuit 17.

In the above embodiment, the third-order intermodulation distortion is reduced. An n-order intermodulation distortion may be reduced by a similar method.

While the invention has been described in detail, the foregoing description is in all aspects illustrative and not restrictive. It is understood that numerous other modifications and variations can be devised without departing from the scope of the invention.

What is claimed is:

1. A radio frequency amplification apparatus including a plurality of radio frequency amplifiers connected to each other, the radio frequency amplification apparatus comprising:

an input matching circuit operable to perform matching processing with a pre-stage device;

a first-stage amplifier operable to amplify an output from the input matching circuit;

an inter-stage matching circuit operable to perform matching Processing with the first-stage amplifier;

a final-stage amplifier operable to amplify an output from the inter-stage matching circuit; and a control circuit operable to perform matching processing between the final-stage amplifier and a post-stage device and to feed back an output intermodulation distortion which is output from the final-stage amplifier to the inter-stage matching circuit with a predetermined amplitude and a predetermined phase;

wherein the control circuit controls the amplitude and the phase of the output intermodulation distortion such that an intermodulation distortion having a generally invert phase to an intermodulation distortion newly generated by the final-stage amplifier is generated by synthesizing the output intermodulation distortion and an intermodulation distortion generated by the first-stage amplifier, and wherein the control circuit comprises:

an output matching circuit operable to perform matching processing between the final-stage amplifier and the post-stage device;

an amplitude control circuit operable to control an amplitude of an intermodulation distortion which is output from the output matching circuit by attenuating a desired amount; and a phase control circuit operable to rotate a phase of the intermodulation distortion which is output from the output matching circuit by allowing a desired frequency to pass therethrough.

2. A radio frequency amplification apparatus including a plurality of radio frequency amplifiers connected to each other, the radio frequency amplification apparatus comprising:

an input matching circuit operable to perform matching processing with a pre-stage device;

a first-stage amplifier operable to amplify an output from the input matching circuit:

an inter-stage matching circuit operable to perform matching processing with the first-stage amplifier:

a final-stage amplifier operable to amplify an output from the inter-stage matching circuit; and a control circuit operable to perform matching processing between the final-stage amplifier and a post-stage device and to feed back an output intermodulation distortion which is output from the final-stage amplifier to the inter-stage matching circuit with a predetermined amplitude and a predetermined phase;

wherein the control circuit controls the amplitude and the phase of the output intermodulation distortion such that an intermodulation distortion having a generally invert phase to an intermodulation distortion newly generated by the final-stage amplifier is generated by synthesizing the output intermodulation distortion and an intermodulation distortion generated by the first-stage amplifier, and wherein the control circuit comprises:

a phase control/matching circuit operable to perform a part of the matching processing between the final-stage amplifier and the post-stage device and to rotate a phase of the output intermodulation distortion which is output from the final-stage amplifier by allowing a desired frequency to pass therethrough;

an output matching circuit operable to perform the remaining part of the matching processing between the final-stage amplifier and the post-stage device; and an amplitude control circuit operable to control an amplitude of an intermodulation distortion which is output from the phase control/matching circuit by attenuating a desired amount.

3. The radio frequency amplification apparatus according to claim 1, wherein:

the amplitude control circuit is a series resistor inserted at a feedback path; and the phase control circuit is a capacitor-inductor-capacitor circuit inserted at the feedback path.

4. The radio frequency amplification apparatus according to claim 1, wherein:

the phase control circuit is a capacitor-capacitor circuit inserted at a feedback path; and the amplitude control circuit is a parallel resistor connected between the capacitors.

5. The radio frequency amplification apparatus according to claim 2, wherein:

the phase control/matching circuit includes a bias line and a parallel capacitor connected in parallel to the output intermodulation distortion which is output from the final-stage amplifier, and a DC cut capacitor inserted in series at a stage post to the parallel capacitor; and the amplitude control circuit is a series resistor inserted between an output of the DC cut capacitor and the inter-stage matching circuit.

6. The radio frequency amplification apparatus according to claim 2, wherein:

the phase control/matching circuit includes a bias line and a parallel capacitor connected in parallel to the output intermodulation distortion which is output from the final-stage amplifier; and the amplitude control circuit is a parallel resistor inserted at a path connected to an output of the parallel capacitor and to a parallel circuit component of the inter-stage matching circuit.

* * * * *